United States Patent
Rosahl

[11] Patent Number: 6,150,854
[45] Date of Patent: Nov. 21, 2000

[54] CIRCUIT ARRANGEMENT FOR SWITCHING AN INDUCTIVE LOAD

[75] Inventor: Thoralf Rosahl, Reutlingen, Germany

[73] Assignee: Robert Bosch GmbH, Stuttgart, Germany

[21] Appl. No.: 09/197,007

[22] Filed: Nov. 20, 1998

[30] Foreign Application Priority Data

Nov. 21, 1997 [DE] Germany .................. 197 51 651

[51] Int. Cl.[7] .................................. H03K 19/082
[52] U.S. Cl. ..................... 327/110; 327/112; 327/427
[58] Field of Search ........................... 327/108, 110, 327/111, 112, 427, 430, 431, 434, 436, 437

[56] References Cited

U.S. PATENT DOCUMENTS

| | | | |
|---|---|---|---|
| 5,047,662 | 9/1991 | Edwards | 327/110 |
| 5,894,236 | 4/1999 | Mizoguchi | 327/108 |
| 5,959,473 | 9/1999 | Sakugari | 327/111 |

*Primary Examiner*—Toan Tran
*Assistant Examiner*—Paul Dinh
*Attorney, Agent, or Firm*—Kenyon & Kenyon

[57] ABSTRACT

Circuit arrangement for switching an inductive load, for example in clocked voltage regulators, includes a switching transistor which is operated in a high-side circuit and is connected to a free-running transistor in a half-bridge arrangement, with the inductive load to be switched positioned in a node between the switching transistor and the free-running transistor. The circuit arrangement also includes a driving circuit for the switching transistor. The switching transistor is connected to an auxiliary transistor in a current balancing arrangement, and the current balancing mode of the transistors can be controlled as a function of a potential present in the node.

6 Claims, 1 Drawing Sheet

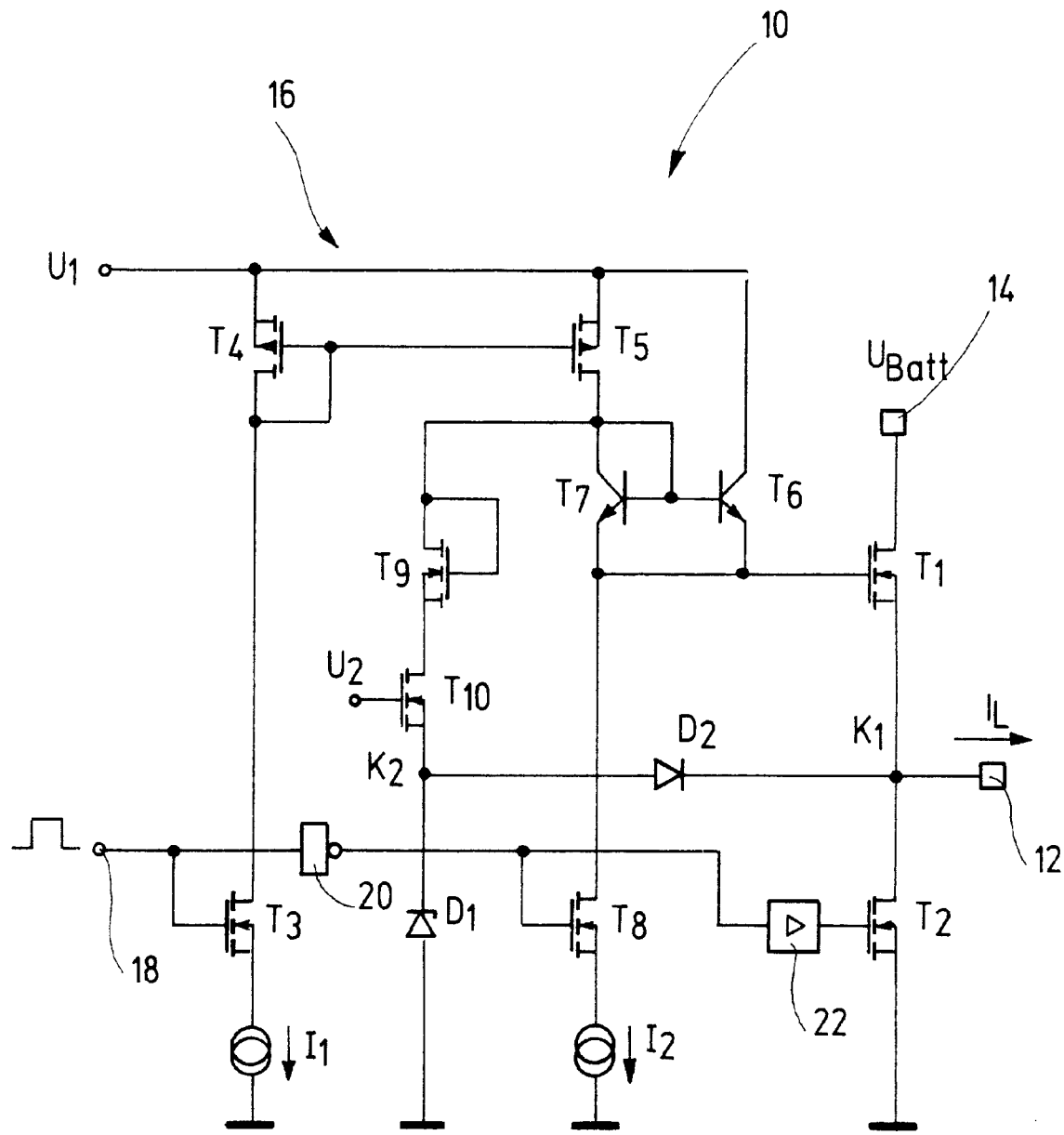

CIRCUIT ARRANGEMENT FOR SWITCHING AN INDUCTIVE LOAD

BACKGROUND INFORMATION

Switching inductive loads using a switching transistor operated in a high-side circuit is known. Upon turning off, the current flowing through the inductive load must be provided with a free-running path. For this purpose, for example, the switching transistor is connected in a half-bridge circuit arrangement to a free-running transistor which can be energized alternately with the switching transistor, with the inductive load to be switched positioned in a node between the transistors. The disadvantage of this arrangement is that a cross current can flow across the free-running transistor when switching over to the switching transistor.

SUMMARY OF THE INVENTION

The circuit arrangement according to the present invention offers the advantage that selective activation of the switching transistor makes it possible to minimize the occurrence of cross currents. The cross current in the half-bridge arrangement can be advantageously limited while the switching transistor is being activated by connecting the switching transistor to an auxiliary transistor in a current balancing (current mirror) arrangement, making it possible to control the current balancing mode of these transistors as a function of a potential present in the node where the inductive load is located. Because the current balancing arrangement is relatively simple, this can be achieved with a simple circuit layout which can be monolithically integrated into a component containing the switching transistor and the free-running transistor. This arrangement can thus be produced without any additional components functioning as the free-running circuit. The simple circuit layout makes it possible to limit cross currents even at high switching frequencies at which the inductive load is activated and deactivated.

BRIEF DESCRIPTION OF THE DRAWINGS

The FIGURE shows a circuit arrangement for switching an inductive load.

DETAILED DESCRIPTION

The FIGURE shows a circuit arrangement 10 which can be used to establish a connection between an inductive load connected to a terminal 12 and a supply voltage connected to a terminal 14, generally a car battery $U_{Batt}$ of a motor vehicle. A switching transistor $T_1$, whose drain is connected to terminal 14 and whose source is connected to terminal 12, is provided for this purpose. Switching transistor $T_1$ is thus operated in a high-side circuit. The drain of a free-running transistor $T_2$ is connected to a node $K_1$, and its source is connected to ground.

Transistors $T_1$ and $T_2$ connected in a half-bridge circuit arrangement can be activated by a driving circuit 16. An implied output signal, for example from the closed-loop control system of a switching controller, is present at an input terminal 18. Output terminal 18 is connected to a driver circuit 20 and to the gate of a transistor $T_3$. The source of transistor $T_3$ is connected to ground via a current sink $I_1$. The drain of transistor $T_3$ is connected to the gate terminals of transistors $T_4$ and $T_5$. The source terminals of transistors $T_4$ and $T_5$ are each connected to a voltage potential $U_1$. The source terminals of transistors $T_4$ and $T_5$ are also connected to the collector of a transistor $T_6$, whose base is connected to the base of a transistor $T_7$. The emitters of transistors $T_6$ and $T_7$ are short-circuited and connected to the gate terminal of switching transistor $T_1$ and to a drain terminal of a transistor $T_8$. The source terminal of transistor $T_8$ is connected to ground via a current sink $I_2$. The base terminals of transistors $T_6$ and $T_7$ are also connected to the drain of a transistor $T_9$, whose source terminal is connected to the drain of a transistor $T_{10}$. The gate terminal of transistor $T_{10}$ is set to a voltage potential $U_2$, while its source terminal is connected, via node $K_2$, to ground via a Zener diode $D_1$, and to node $K_1$, via a diode $D_2$.

One output of driver circuit 20 is connected to the gate of transistor $T_8$ and to the gate of free-running transistor $T_2$ via a further driver circuit 22.

The circuit arrangement shown is used to interconnect switching transistor $T_1$ and transistor $T_9$ in a current balancing arrangement. Transistors $T_4$ and $T_5$ as well as transistors $T_6$ and $T_7$ are also interconnected in a current balancing arrangement. In doing so, the circuit balancing arrangement of transistors $T_6$ and $T_7$ forms the connection between the gate terminals of transistors $T_1$ and $T_9$.

Circuit arrangement 10 has the following functions:

When the signal present at input terminal 18 is in the low switching state, the gate terminals of transistors $T_8$ and $T_2$ are activated by driver circuit 20, thereby driving them high. This places free-running transistor $T_2$ in the conductive state, enabling a load current $I_1$ flowing at terminal 12 to flow across free-running transistor $T_2$. In addition, the gate terminal of transistor $T_1$. is tied to ground by transistor $T_8$, which was driven high, and current sink $I_2$, thereby deactivating switching transistor $T_1$.

When the signal present at input terminal 18 switches over to the high state, driver circuits 20 and 22 start blocking free-running transistor $T_2$. At the same time, the drain terminal of transistor $T_3$ is activated, driving transistor $T_3$ high. The current balancing arrangement of transistors $T_4$ and $T_5$ is activated by current source $I_1$, with this circuit, in turn, activating the current balancing arrangement of transistors $T_6$ and $T_7$. This generates a charging current for the gate of switching transistor $T_1$, driving the latter high. The current balancing arrangement of transistors $T_1$ and $T_9$ initially limits the charging of the switching transistor $T_1$ gate. Diode $D_2$ connected between nodes $K_1$ and $K_2$ is used to initially compensate for a forward voltage in the current balancing arrangement of transistors $T_6$ and $T_7$. This ensures that the current supplied by switching transistor $T_1$ cannot increase to more than the current level achieved by the ratio between current balancing transistors $T_1$ and $T_9$ while free-running transistor $T_2$ is being switched off.

When free-running transistor $T_2$ has been switched over to the blocked state by the driving action of driver circuits 20 and 22, the potential in node $K_1$ begins to rise. Depending on a selected level of voltage potential $U_2$ present at the gate terminal of transistor $T_{10}$, the user can now set the point at which transistors $T_1$ and $T_9$ leave the current balancing mode. This takes place when transistor $T_{10}$ can no longer conduct the reference current in the current balancing arrangement of transistors $T_1$ and $T_9$ through transistor $T_1$, due to the rising potential in nodes $K_1$ and $K_2$. Zener diode $D_1$ then limits the voltage in high-resistance node $K_2$, while diode $D_2$ performs a blocking action between nodes $K_1$ and $K_2$. The gate voltage of switching transistor $T_1$ can now increase to voltage potential $U_1$ and drive transistor $T_1$ high.

Due to this circuit arrangement, a cross current flowing from terminal 14 to ground can be limited while switching transistor $T_1$ is being driven high and free-running transistor $T_2$ is being driven low. Because of the existing dependencies between the current balancing arrangements, driving circuit 16 is self-regulating, depending on the level of the signal present at input terminal 18. The arrangement achieves effective, controlled cross current limiting even at high switching frequencies, i.e. when the signal present at input terminal 18 switches frequently between the low and high states. Furthermore, it can reduce disturbances produced by pulsating currents that occur on a supply conductor to terminal 14.

What is claimed is:

1. A circuit arrangement for switching an inductive load, comprising:

a free-running transistor;

a switching transistor operated in a high-side circuit and coupled to the free-running transistor in a half-bridge arrangement, the inductive load being coupled to a node between the switching transistor and the free-running transistor;

a driving circuit coupled to the switching transistor; and an auxiliary transistor, the switching transistor being coupled to the auxiliary transistor in a current balancing arrangement, a current balancing mode of the switching transistor and of the auxiliary transistor being controlled as a function of a potential present in the node.

2. The circuit arrangement according to claim 1, further comprising a second current balancing arrangement of transistors and a third current balancing arrangement of transistors, gate terminals of the switching and auxiliary transistors being interconnected via the second current balancing arrangement, the second current balancing arrangement being activated by the third current balancing arrangement, the third current balancing arrangement being activated as a function of a driving signal for the switching transistor.

3. The circuit arrangement according to claim 1, further comprising a further transistor coupled in series with the auxiliary transistor, a gate of the further transistor being coupled to a control voltage, a source of the further transistor being coupled to the node.

4. The circuit arrangement according to claim 1, wherein the current balancing mode is set via a level of a control voltage.

5. The circuit arrangement according to claim 3, further comprising a diode coupled between the source of the further transistor and the node.

6. The circuit arrangement according to claim 3, further comprising a Zener diode coupling the source of the further transistor to ground.

* * * * *